US 7,411,658 B2

(12) United States Patent
Beckers et al.

(10) Patent No.: US 7,411,658 B2
(45) Date of Patent: Aug. 12, 2008

(54) LITHOGRAPHIC APPARATUS AND DEVICE MANUFACTURING METHOD (75) Inventors: Marcel Beckers, Eindhoven (NL); Johannes Henricus Wilhelmus Jacobs, Eindhoven (NL); Nicolaas Ten Kate, Almkerk (NL); Ferdy Migchelbrink, Amersfoort (NL)

(73) Assignee: ASML Netherlands B.V., Veldhoven (NL)

( * ) Notice: Subject to any disclaimer, the term of this patent is extended or adjusted under 35 U.S.C. 154(b) by 279 days.

(21) Appl. No.: 11/244,390

(22) Filed: Oct. 6, 2005

(65) Prior Publication Data
US 2007/0081140 A1   Apr. 12, 2007

(51) Int. Cl.
G03B 27/52   (2006.01)
G03B 27/42   (2006.01)
(52) U.S. Cl. .......................................... 355/72; 355/53
(58) Field of Classification Search ................ 355/30, 355/53, 72, 55; 359/380, 886
See application file for complete search history.

(56) References Cited

U.S. PATENT DOCUMENTS

| 3,573,975 | A | 4/1971 | Dhaka et al. ................ 117/212 |
| 3,648,587 | A | 3/1972 | Stevens .......................... 95/44 |
| 4,346,164 | A | 8/1982 | Tabarelli et al. ............. 430/311 |
| 4,390,273 | A | 6/1983 | Loebach et al. ............. 355/125 |
| 4,396,705 | A | 8/1983 | Akeyama et al. ............ 430/326 |
| 4,480,910 | A | 11/1984 | Takanashi et al. ............ 355/30 |
| 4,509,852 | A | 4/1985 | Tabarelli et al. |
| 5,040,020 | A | 8/1991 | Rauschenbach et al. ....... 355/53 |
| 5,121,256 | A | 6/1992 | Corle et al. .................. 359/664 |
| 5,610,683 | A | 3/1997 | Takahashi .................... 355/53 |
| 5,825,043 | A | 10/1998 | Suwa ........................... 250/548 |
| 5,900,354 | A | 5/1999 | Batchelder ................... 430/395 |
| 6,191,429 | B1 | 2/2001 | Suwa .......................... 250/548 |
| 6,236,634 | B1 | 5/2001 | Lee et al. ..................... 369/112 |
| 6,600,547 | B2 | 7/2003 | Watson et al. ................. 355/30 |
| 6,603,130 | B1 | 8/2003 | Bisschops et al. ......... 250/492.1 |
| 2002/0020821 | A1 | 2/2002 | Van Santen et al. ......... 250/492 |
| 2002/0163629 | A1 | 11/2002 | Switkes et al. ................ 355/53 |
| 2003/0123040 | A1 | 7/2003 | Almogy ....................... 355/69 |
| 2004/0000627 | A1 | 1/2004 | Schuster ................... 250/201.2 |
| 2004/0075895 | A1 | 4/2004 | Lin ............................. 359/380 |
| 2004/0114117 | A1 | 6/2004 | Bleeker ........................ 355/53 |
| 2004/0136494 | A1 | 7/2004 | Lof et al. |
| 2004/0160582 | A1 | 8/2004 | Lof et al. ...................... 355/30 |

(Continued)

FOREIGN PATENT DOCUMENTS

DE           206 607       2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Peter B Kim
(74) *Attorney, Agent, or Firm*—Pillsbury Winthrop Shaw Pittman, LLP (57) ABSTRACT

A protrusion is provided on a barrier member which at least partly confines a liquid between a projection system and a substrate. The protrusion is closer to the projection system than other parts of the barrier member to promote a meniscus of liquid to adhere between the protrusion and the projection system.

32 Claims, 5 Drawing Sheets

U.S. PATENT DOCUMENTS

| | | | |
|---|---|---|---|
| 2004/0165159 A1 | 8/2004 | Lof et al. ................. | 355/30 |
| 2004/0207824 A1 | 10/2004 | Lof et al. | |
| 2004/0211920 A1 | 10/2004 | Derksen et al. .......... | 250/492.1 |
| 2004/0239954 A1 | 12/2004 | Bischoff .................. | 356/635 |
| 2004/0257544 A1 | 12/2004 | Vogel et al. .............. | 355/30 |
| 2004/0263809 A1 | 12/2004 | Nakano .................... | 355/30 |
| 2005/0018155 A1 | 1/2005 | Cox et al. ................. | 355/30 |
| 2005/0024609 A1 | 2/2005 | De Smit et al. ........... | 355/18 |
| 2005/0030497 A1 | 2/2005 | Nakamura ................ | 355/30 |
| 2005/0046813 A1 | 3/2005 | Streefkerk et al. ........ | 355/30 |
| 2005/0046934 A1 | 3/2005 | Ho et al. .................. | 359/380 |
| 2005/0052632 A1 | 3/2005 | Miyajima ................. | 355/53 |
| 2005/0094116 A1 | 5/2005 | Flagello et al. ........... | 355/53 |
| 2005/0094125 A1 | 5/2005 | Arai ........................ | 355/72 |
| 2005/0122505 A1 | 6/2005 | Miyajima ................. | 355/72 |
| 2005/0132914 A1 | 6/2005 | Mulkens et al. .......... | 101/463.1 |
| 2005/0134817 A1 | 6/2005 | Nakamura ................ | 355/53 |
| 2005/0140943 A1 | 6/2005 | Tokita ..................... | 355/30 |
| 2005/0146693 A1 | 7/2005 | Ohsaki .................... | 355/30 |
| 2005/0146694 A1 | 7/2005 | Tokita ..................... | 355/30 |
| 2005/0151942 A1 | 7/2005 | Kawashima .............. | 355/30 |
| 2005/0200815 A1 | 9/2005 | Akamatsu ................ | 353/53 |
| 2005/0213065 A1 | 9/2005 | Kitaoka ................... | 355/53 |
| 2005/0213066 A1 | 9/2005 | Sumiyoshi ............... | 355/53 |
| 2005/0219489 A1 | 10/2005 | Nei et al. ................. | 355/53 |
| 2005/0233081 A1 | 10/2005 | Tokita ..................... | 427/256 |
| 2005/0259233 A1 | 11/2005 | Streefkerk et al. ........ | 355/53 |
| 2005/0270506 A1 | 12/2005 | Streefkerk et al. ........ | 355/53 |
| 2006/0176456 A1 | 8/2006 | Nagasaka et al. ......... | 355/53 |
| 2006/0215131 A1 | 9/2006 | Van Der Toorn et al. .. | 355/30 |
| 2006/0221315 A1* | 10/2006 | Beckers et al. ........... | 355/30 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2005/024517 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths TO Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasability of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greated than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.

G. Owen et al., "1/8 µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

\* cited by examiner

FIG. 8

LITHOGRAPHIC APPARATUS AND DEVICE MANUFACTURING METHOD

1. FIELD

The present invention relates to a lithographic apparatus and a method for manufacturing a device.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning structure, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning structure to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
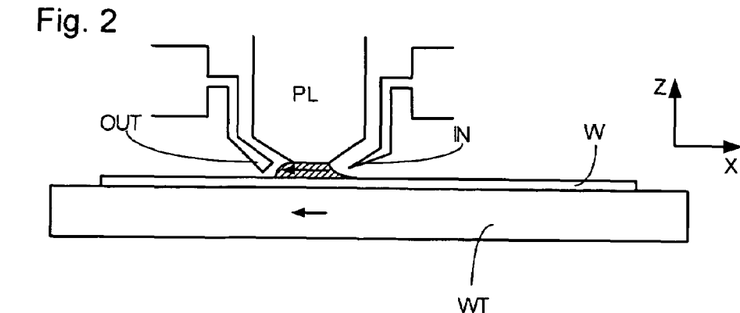
FIGS. 2 and 3 depict a liquid supply system for use in a lithographic projection apparatus.
Figure 3:
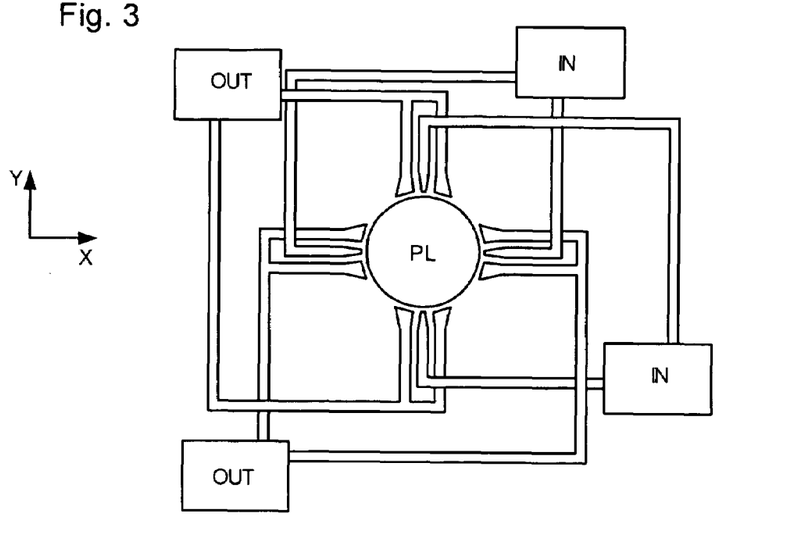

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
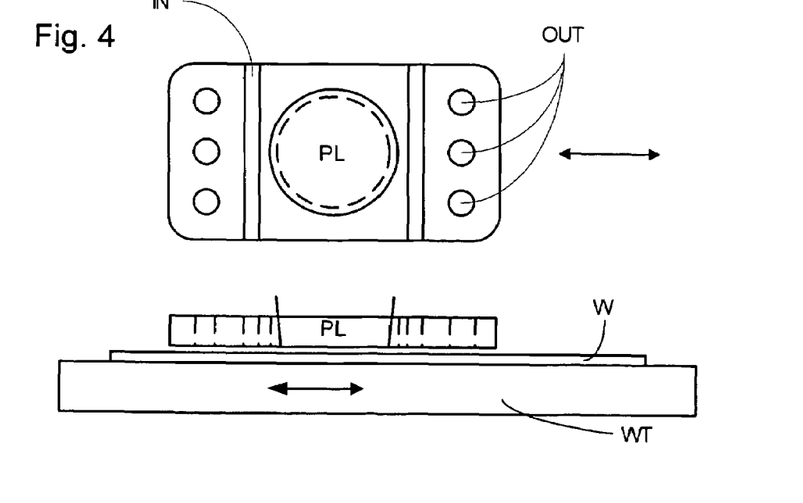
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member which extends along at least a part of a boundary of the space between the final element of the projection system and the substrate table. The barrier member is substantially stationary relative to the projection system in the XY plane though there may be some relative movement in the Z direction (in the direction of the optical axis). A seal is formed between the barrier member and the surface of the substrate. In an embodiment, the seal is a contactless seal such as a gas seal. Such a system with a gas seal is disclosed in U.S. patent application Publication No. US 2004-0207824, hereby incorporated in its entirety by reference.

In European patent application publication no. EP 1420300 and United States patent application publication no. US 2004-0136494, each hereby incorporated in their entirety by reference the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

Providing an immersion liquid between the projection system and the substrate for the patterned radiation beam to pass through presents particular challenges. For example, with a barrier member, control of the level of liquid in the space may be difficult—too much liquid and overflow may occur, too little liquid and bubbles may be included in the liquid between the projection system and the substrate.

3. SUMMARY

Accordingly, it would be advantageous, for example, to provide a liquid supply system in which measures are taken to reduce the chance of overflow or bubble inclusion.

According to an aspect of the invention, there is provided a lithographic apparatus, comprising:

a projection system configured to project a patterned radiation beam onto a target portion of a substrate;

a barrier member, surrounding a space between the projection system and the substrate, to define in part a reservoir for liquid; and a protrusion which surrounds the projection system and is on the barrier member such that a surface of the protrusion is closer to the projection system than a part of the barrier member on a radially outward side of the protrusion or is on the projection system such that a surface of the protrusion is closer to the barrier member than a part of the projection system on a radially outward side of the protrusion.

According to an aspect of the invention, there is provided a lithographic apparatus, comprising:

a projection system configured to project a patterned radiation beam onto a target portion of a substrate; and a barrier member, surrounding a space between the projection system and the substrate, to define in part a reservoir for liquid, wherein a surface of the barrier member, a surface of the projection system, or both, is shaped such that there is a step increase in a distance between the two to increase resistance against a meniscus of a liquid when contained in the reservoir passing radially outwardly of that step increase.

According to an aspect of the invention, there is provided a lithographic apparatus, comprising:

a projection system configured to project a patterned radiation beam onto a target portion of a substrate; and a liquid supply system configured to provide liquid to a space between a final element of the projection system and the substrate, the liquid supply system comprising an inlet configured to direct liquid into the space with a component in a direction away from the substrate.

According to an aspect of the invention, there is provided a lithographic apparatus, comprising:

a projection system configured to project a patterned radiation beam onto a target portion of a substrate; and a liquid supply system configured to provide liquid to a space between a final element of the projection system and the substrate, the liquid supply system structured and arranged to create a flow of liquid in the space downwards and radially inwardly starting from above a bottom surface of the final element.

According to an aspect of the invention, there is provided a device manufacturing method comprising projecting a patterned beam of radiation through a liquid onto a substrate using a projection system, wherein the liquid is confined to a reservoir between the projection system and the substrate at least in part by a barrier member and wherein a meniscus of the liquid either extends between a protrusion on the barrier member and the projection system wherein the protrusion is closer to the projection system than a part of the barrier member radially outwardly of the protrusion or extends between a protrusion on the projection system and the barrier member wherein the protrusion is closer to the barrier member than a part of the projection system radially outwardly of the protrusion.

According to an aspect of the invention, there is provided a device manufacturing method comprising projecting a patterned beam of radiation through a liquid onto a substrate using a projection system wherein the liquid is contained between the projection system and the substrate at least in part by a barrier member, the barrier member, the projection system, or both, shaped such that there is a step increase in a distance between the barrier member and the projection system and a meniscus extends on one side of the step between the barrier member and the projection system.

According to an aspect of the invention, there is provided a device manufacturing method comprising projecting a patterned beam of radiation through a liquid onto a substrate using a projection system, wherein the liquid is provided between the projection system and the substrate using an inlet of a liquid supply system which inlet directs liquid with a component in a direction away from the substrate.

According to an aspect of the invention, there is provided a device manufacturing method comprising projecting a patterned beam of radiation through a liquid onto a substrate using a projection system, wherein the liquid is provided between the projection system and the substrate by a liquid supply system, the liquid flowing in the space downwards and radially inwardly starting from above a bottom surface of a final element of the projection system.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

5. DETAILED DESCRIPTION

Figure 1:
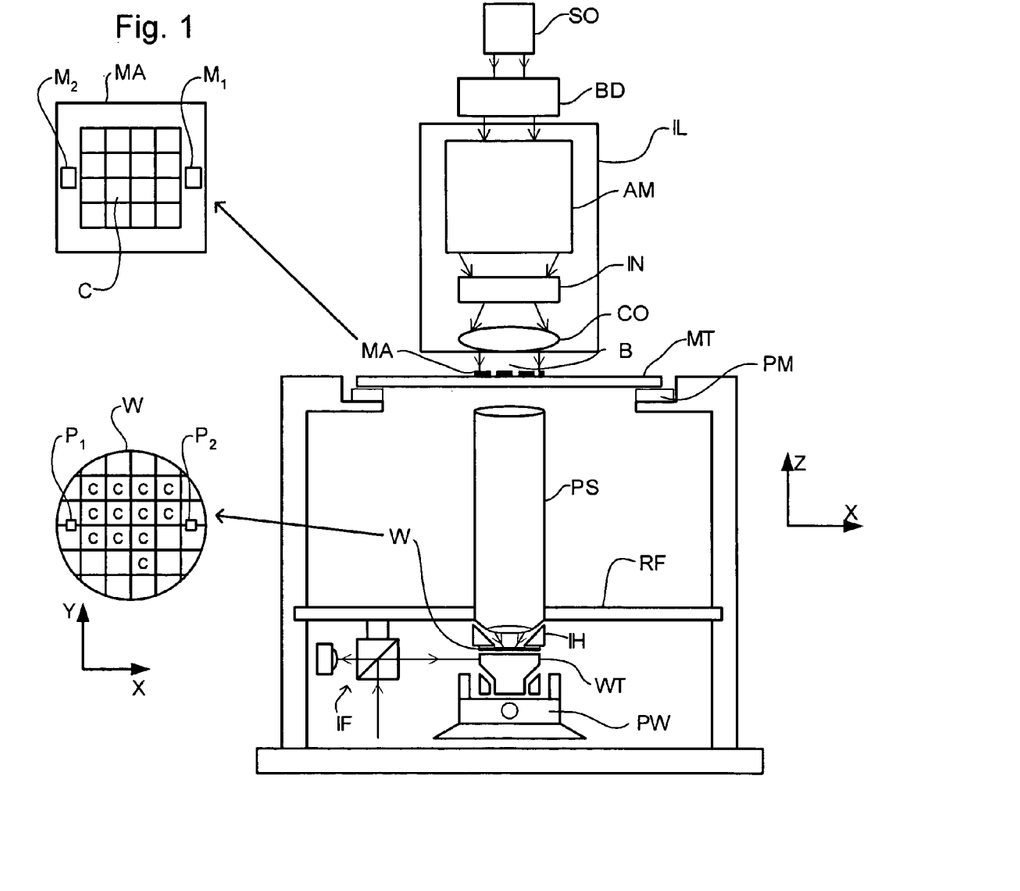
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning structure (e.g. a mask) MA and connected to a first positioner PM configured to accurately position the patterning structure in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning structure MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure may be a frame or a table, for example, which may be fixed or movable as required. The support structure may ensure that the patterning structure is at a desired position, for example with respect to the projection system. Any use of the terms "reticle" or "mask" herein may be considered synonymous with the more general term "patterning structure."

The term "patterning structure" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning structure (e.g., mask) MA, which is held on the support structure (e.g., mask table) MT, and is patterned by the patterning structure. Having traversed the patterning structure MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning structure MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning structure MA and substrate W may be aligned using patterning structure alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning structure MA, the patterning structure alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the radiation beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 5:
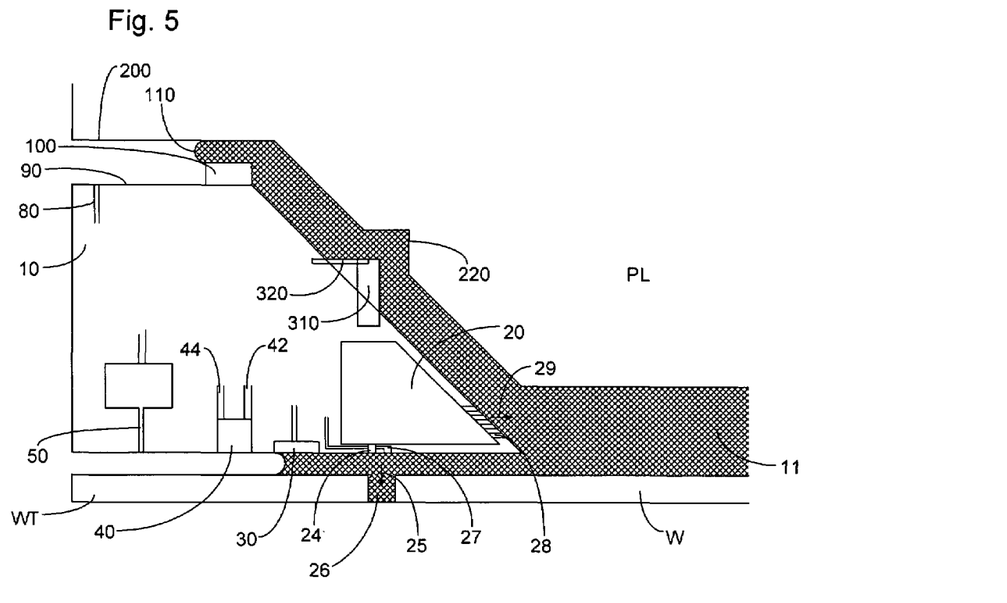
FIG. 5 depicts, in cross-section, a liquid supply system according to an embodiment of the invention.

FIG. 5 illustrates, in cross-section, a liquid supply system in accordance with an embodiment of the invention. The liquid supply system comprises a barrier member 10 which at least partly or completely surrounds a space between the projection system PL and the substrate W and having a barrier surface that defines along with the projection system PL and the substrate W (and/or the substrate table WT) a reservoir for the liquid 11. In this way, liquid 11 can be provided in that space so that the patterned radiation beam projected through the projection system PL onto the substrate W passes through the liquid 11.

In an embodiment, a contactless seal may be formed between the barrier member 10 and the substrate W (or substrate table WT when an edge of the substrate W is being imaged). In the illustrated embodiment, the contactless seal comprises a liquid removal device 30, a recess 40 radially outwardly of the liquid removal device which has, at a radially inwardly top surface, a gas inlet 42 and, at a radially outwardly surface, a gas outlet 44, and a gas knife 50 radially outwardly of the recess 40. The arrangement of these three items on the bottom surface of the barrier member 10 is described in detail in U.S. patent application U.S. 60/643,626, filed 14 Jan. 2005, hereby incorporated in its entirety by reference. Details of the liquid removal device 30 are disclosed in U.S. patent application Ser. No. 10/921,348, filed Aug. 19, 2004, hereby incorporated in its entirety by reference.

Liquid is provided by the barrier member 10 to a chamber 20 at high pressure. The liquid enters the space between the projection system PL and the substrate W through one or more inlets 28 in a substantially horizontal direction (i.e. substantially parallel to the top surface of the substrate W as illustrated by arrow 29). Liquid also exits the chamber 20 through one or more inlets 24 which direct the flow of liquid in a direction away from the projection system PL vertically downwards as illustrated by arrow 25 (towards the substrate W). This flow of liquid is intended to fill a gap 26 which is usually present between the substrate W and the substrate table WT and also to keep the meniscus under the barrier member 10 radially outwardly of the inner side of the liquid removal device 30 especially during scanning of the substrate W under the barrier member 10. The filling of this gap 26 with the flow of liquid out of inlet 24 may reduce the occurrence of bubbles in that gap.

In an embodiment, the inlet 24 comprises a series of discrete holes positioned in a circle (or other shape around the image field of the projection system PL). The purpose of this inlet and these holes is to prevent the meniscus between the barrier member 10 and the substrate W from being drawn into the space between the projection system PL and the substrate W when an edge of the substrate W is being imaged or when the scan speed exceeds a certain magnitude. If gas (e.g., air) from the outward side of the meniscus is included under the projection system during relative movement of substrate W to the projection system PL, this may deleteriously affect the imaging quality. However, with a series of discrete holes, gas may get trapped between the holes and thereby build-up in the gap 26 between the substrate W and substrate table WT. Such bubbles may then enter the liquid 11 between the substrate W and the projection system PL. For this reason, one or more outlets 27 are also provided next to the inlet 24 and a mixture of gas and liquid is extracted through the outlet 27 so that any gas trapped in the gap 26 can escape and liquid can fill the hole of the gap 26 without trapping any gas bubbles. The outlet 27 may be connected to a chamber (not illustrated), such as the chamber 20, to reduce pressure fluctuations at the outlet 27. The outlet 27 may comprise a series of discrete holes positioned in a circle (or other shape around the image field of the projection system PL). In an embodiment, there is provided an inlet 24 that forms an outer perimeter of holes and an outlet 27 that forms an inner perimeter of holes so that when passing over the gap 26 the gap 26 is first filled by inlet 24 and then the bubbles are extracted by outlet 27. However, the precise positioning of the inlet 24 and outlet 27 may be otherwise so long as the function is achieved. The outlet holes 27 may also be used to extract liquid that could be contaminated by resist dissolving under the projection system. With such extraction the liquid near the meniscus (near the liquid removal device 30) will be less contaminated. The liquid that is left behind on the substrate W during scanning may then also be less contaminated and therefore the amount of particles left behind on the substrate may be reduced as may drying stains following liquid removal.

The barrier member 10 is generally shaped to conform with the outer shape of the projection system PL such that a constant gap exits between the projection system PL and the barrier member 10. A gap is present in order that independent relative movement of the projection system PL and barrier member 10 is possible.

In an embodiment, measures are taken in order to deal with variations in the volume of the reservoir and variations in liquid supply/extraction from the reservoir. In normal conditions, the top surface of the liquid 11 has a meniscus 110 which is substantially stationary relative to the projection system and the barrier member 10. The top surface 90 of the barrier member 10 is a horizontal surface which is flat and liquid is only allowed to be present on the top surface 90 in emergency situations. In order to deal with emergency situations, an outlet 80 is provided in the top surface 90. Once the meniscus 110 is on the top surface 90 it can advance easily and the barrier member 10 is likely to overflow. In order to prevent this, a protrusion 100 is provided on the top surface 90 of the barrier member 10 at an inner most edge of the barrier member. The protrusion 100 extends around the barrier member 10 and thus forms a ring or other enclosing shape. The protrusion 100 is closer to the surface of the projection system PL, in particular the horizontal surface 200 of the projection system PL, than parts of the barrier member 10 surrounding the protrusion 100 are to the surface of the projection system PL.

In an embodiment, there is a step change in distance from between the protrusion 100 and the projection system PL to between the barrier member 10 and the projection system PL. This step change can be seen on the left hand side of the protrusion 100 in FIG. 5. In an embodiment, this step change is on the radially outwardly side of the protrusion 100 but may also or optionally be present on the radially inward side of the protrusion 100 as is the case in FIG. 5. This geometry means that in order for the meniscus 110 of the top of the liquid 11 to pass the protrusion 100 the length of the meniscus 110 will need to increase which requires a great deal of energy. In an embodiment, surfaces of both the protrusion 100 and the projection system PL in the region of the protrusion are formed of liquidphobic materials (e.g., the liquid makes a contact angle with those surfaces of less than 60°, 50°, 40°, 30° or 25°) such that the shape of the meniscus 110 is convex.

Thus, the provision of a step increase in the distance between the surface of the projection system PL and the barrier member 10 in a radially outward direction may significantly decrease the chances of overflow when using a barrier member 10.

Figure 8:
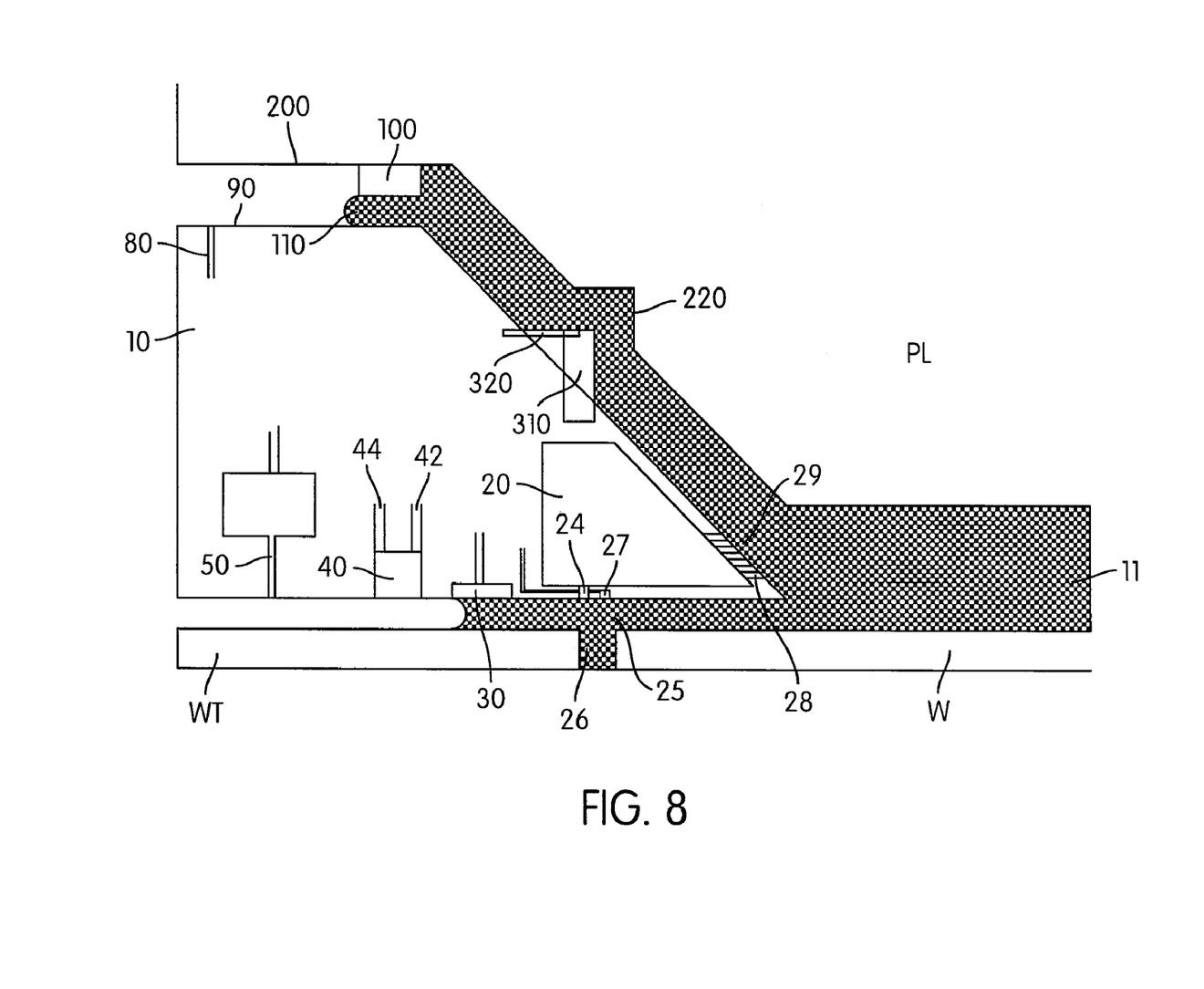
FIG. 8 depicts, in cross-section a liquid supply system in accordance with another embodiment of the invention.

The protrusion 100 is illustrated as being on the baffler member 10. However, as shown in FIG. 8, this need not be the case and the protrusion may be on the projection system so long as the same function (i.e. providing an energy barrier for the meniscus to overcome to move past the protrusion) is fulfilled.

Also illustrated in FIG. 5 is a system in which the inner surface of the barrier member 10 facing the projection system PL is deliberately misformed such that it more closely resembles the outer surface of the projection system PL which may also be deliberately misformed. In this way a labyrinth is created for the liquid 11 to flow up towards the protrusion 100 from the substrate and this increases the flow restriction and thereby decreases the risk of overflowing. Thus, the path which the liquid would need to take in order to overflow over the barrier 10 would be tortuous and require at least three changes of direction. In the illustrated embodiment this is achieved by the provision of an indentation 220 in a side wall of the projection system PL and a protrusion on the inner side wall of the barrier member 10 (in the barrier surface) formed by two elements 310, 320. Other measures can also be taken in order to increase the tortuousness of the path for liquid to follow from a position between the projection system PL and the substrate W to the top of the barrier member 10.

Figure 6:
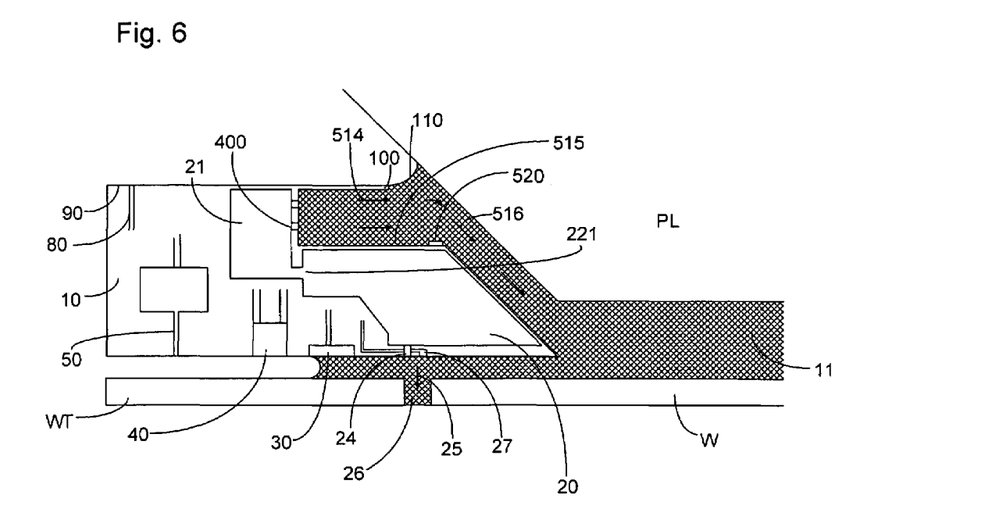
FIG. 6 depicts, in cross-section a liquid supply system in accordance with another embodiment of the invention.

FIG. 6 illustrates another embodiment of the invention which is the same as the embodiment described above in respect of FIG. 5, except as described below.

In this embodiment, instead of the provision of one or more inlets 28 which provide a flow of liquid into the space between the projection system PL and the substrate W in a substantially horizontal direction under the final element of the projection system, one or more inlets 400 are provided which provide a homogeneous flow of liquid at a low velocity against the side of the projection system PL. This flow is illustrated by arrows 514. The liquid which exits the inlet 400 is provided from a chamber 21 which is in fluid communication with the chamber 20. The provision of two chambers allows the pressure of liquid applied to inlet 400 and to inlet 24 to be different and this can be adjusted by varying the size and/or number of holes 221 which connect the chambers 20 and 21.

The protrusion 100 in this embodiment is similar to that as described above in respect of FIG. 5 in that the meniscus 110 of liquid 11 extends between the protrusion 100 and the projection system PL. Although the construction of the protrusion 100 in this embodiment is different, the same principles apply i.e. that the protrusion is closer to the projection system PL than other parts of the barrier member 10 in close proximity such that for the meniscus 110 to pass the protrusion 100 it is necessary for the length of the meniscus to increase greatly.

The horizontal flow of liquid is prevented from being sucked downwards towards the substrate W by the presence of a second protrusion 520 at the radially inner most edge of the horizontal portion 515 below where the inlet 400 exits. This allows the horizontal flow of liquid 514 to be deflected by a surface of the projection system PL to create a flow 516 downwards and radially inward starting from above a bottom surface of the projection system PL.

This arrangement overcomes a disadvantage of the tendency of the inlet 28 of the embodiment described in respect of FIG. 5 to create a strong downward flow which can draw the meniscus 110 downwards leading to a possibly unstable meniscus position. An unstable meniscus may result in gas entrapment in the liquid supply as a large tongue of gas may extend under the projection system PL when the liquid supply rate exceeds a certain value. Avoidance of such a disadvantage may achieved in this embodiment because this embodiment may allow for a lowering of the outflow velocity from inlet 400 in comparison to that from inlet 28 and allows the barrier member 10 to be positioned closer to the projection system PL. The protrusion 100 ensures that the meniscus 110 is as short as possible so that it requires a great deal of energy to be drawn downwards where the length of the meniscus would need to be increased.

Figure 7:
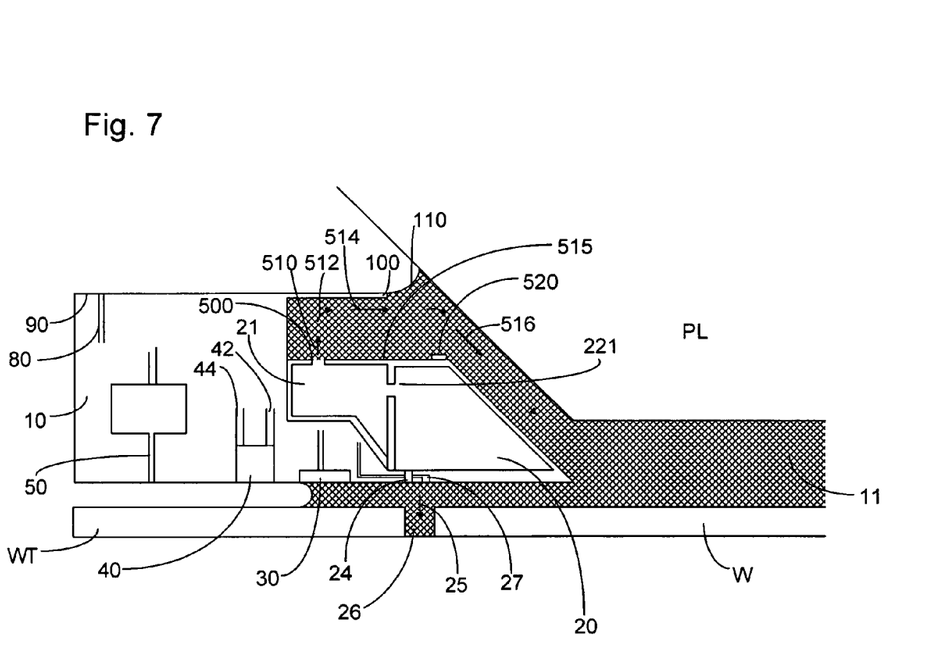
FIG. 7 depicts, in cross-section a liquid supply system in accordance with another embodiment of the invention.

FIG. 7 illustrates another embodiment of the invention which is the same as the embodiment described with respect to FIG. 6, except as described below.

In this embodiment, instead of the provision of inlet 400 which provides a flow of liquid into the space between the projection system PL and the substrate W in a substantially horizontal direction, an inlet 500 is provided which provides a flow of liquid into the space defined between the substrate W, the projection system PL and the barrier member 10 in a direction away from the substrate W (i.e., in a direction opposite to the direction of propagation of the patterned radiation beam) as illustrated by arrow 510. The liquid which exits the inlet 500 is provided from a chamber 21 which is in fluid communication with the chamber 20 as described above with respect to FIG. 6.

The flow of liquid exiting the inlet 500 is deflected by protrusion 100 to a direction radially inwardly and substantially parallel to the top surface of the substrate W as in the embodiment described above with respect to FIG. 6. This is illustrated by arrows 512, 514. The protrusion 100 in this embodiment is similar to that of the other embodiments in that the meniscus 110 of liquid 11 extends between the protrusion 100 and the projection system PL. Although the construction of the protrusion 100 in this embodiment is different to that of the embodiment described above with respect to FIG. 5, the same principles apply i.e. that the protrusion is closer to the projection system PL than other parts of the barrier member 10 in close proximity such that for the meniscus 110 to pass the protrusion 100 it is necessary for the length of the meniscus to increase greatly.

After the flow 510 is deflected by the protrusion 100, the flow is homogenized as in the embodiment described above with respect to FIG. 6 and flows at a relatively slow speed substantially horizontally against the projection system PL. The protrusion 100 ensures that the meniscus 110 is as short as possible so that it requires a great deal of energy to be drawn downwards where the length of the meniscus would need to be increased. This embodiment may be advantageous over the embodiment described above with respect to FIG. 6 because it may use less space.

In all of the above embodiments, cross-sections have been shown of the barrier member 10. The barrier member 10 is not necessarily symmetrical around its entire periphery and it could be, for instance, that the inlets 28, 400, 500 are provided only around a fraction of a periphery of the barrier member 10 and that a system for extraction of immersion liquid is provided around other parts. Such an arrangement can lead to a flow of liquid 11 across the space between the projection system PL and the substrate W in a single direction. Other arrangements are also possible and the principles described above in relation to the above described embodiments may also be applied to other types of liquid supply system. It will be clear that features of any embodiment may be used in conjunction with some or all features of any other embodiment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning structure defines the pattern created on a substrate. The topography of the patterning structure may be pressed into a layer of resist supplied to the substrate whereupon the resist is cured by applying electromagnetic radiation, heat, pressure or a combination thereof. The patterning structure is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
    a projection system configured to project a patterned radiation beam onto a target portion of a substrate;
    a barrier member, surrounding a space between the projection system and the substrate, to define in part a reservoir for liquid; and
    a protrusion which surrounds the projection system and is on the barrier member such that a surface of the protrusion is closer to the projection system than a part of the barrier member on a radially outward side of the protrusion is to the surface of the projection system, or the protrusion is on the projection system such that a surface of the protrusion is closer to the barrier member than a part of the projection system on a radially outward side of the protrusion is to the surface of the barrier member;
    wherein, in a use, liquid simultaneously contacts the surface of the protrusion and a surface of the projection system facing the surface of the protrusion when the protrusion is on the barrier, or simultaneously contacts the surface of the protrusion and a surface of the barrier member facing the surface of the protrusion when the protrusion is on the projection system.

2. The apparatus of claim 1, wherein if the protrusion is attached to the barrier member the surface of the protrusion is closer to the projection system than a part of a surface of the barrier member on a radially inner side of the protrusion, and if the protrusion is attached to the projection system the surface of the protrusion is closer to the barrier member than a part of the projection system on a radially inner side of the protrusion.

3. The apparatus of claim 1, wherein the protrusion is located on a substantially horizontal part of the barrier member.

4. The apparatus of claim 3, wherein the protrusion is located at or in proximity of the radially innermost portion of the horizontal part.

5. The apparatus of claim 1, wherein the surface of the protrusion is liquidphobic.

6. The apparatus of claim 1, wherein the projection system in proximity to the protrusion has a liquidphobic surface, the barrier member in proximity to the protrusion has a liquidphobic surface, or both.

7. The apparatus of claim 1, wherein, in normal use, the level of liquid in the reservoir does not exceed a point at which a top surface meniscus of the liquid extends between the protrusion and the projection system or between the protrusion and the barrier member.

8. The apparatus of claim 1, wherein the protrusion is positioned to deflect radially inwardly a flow of liquid from a direction of the substrate.

9. A lithographic apparatus, comprising:
    a projection system configured to project a patterned radiation beam onto a target portion of a substrate; and a barrier member, surrounding a space between the projection system and the substrate, to define in part a reservoir for liquid, wherein a surface of the barrier member, a surface of the projection system, or both, is shaped such that there is a step increase in a distance between the two to increase resistance against a meniscus of a liquid when contained in the reservoir passing, between the surface of the barrier member and the surface of the projection system, radially outwardly of that step increase.

10. The apparatus of claim 9, wherein the protrusion is located on a substantially horizontal part of the barrier member.

11. The apparatus of claim 10, wherein the protrusion is located at or in proximity of the radially innermost portion of the horizontal part.

12. The apparatus of claim 9, wherein the surface of the protrusion is liquidphobic.

13. The apparatus of claim 9, wherein the projection system in proximity to the protrusion has a liquidphobic surface, the barrier member in proximity to the protrusion has a liquidphobic surface, or both.

14. The apparatus of claim 9, wherein, in normal use, the level of liquid in the reservoir does not exceed a point at which a top surface meniscus of the liquid extends between the protrusion and the projection system or between the protrusion and the barrier member.

15. The apparatus of claim 9, wherein the protrusion is positioned to deflect radially inwardly a flow of liquid from a direction of the substrate.

16. A device manufacturing method comprising projecting a patterned beam of radiation through a liquid onto a substrate using a projection system, wherein the liquid is confined to a reservoir between the projection system and the substrate at least in part by a barrier member and wherein a meniscus of the liquid either extends between a protrusion on the barrier member and the projection system wherein the protrusion is closer to the projection system than a part of the barrier member radially outwardly of the protrusion is to the surface of the projection system, or extends between a protrusion on the projection system and the barrier member wherein the protrusion is closer to the barrier member than a part of the projection system radially outwardly of the protrusion is to the surface of the barrier member.

17. The method of claim 16, wherein if the protrusion is attached to the barrier member the surface of the protrusion is closer to the projection system than a part of a surface of the barrier member on a radially inner side of the protrusion, and if the protrusion is attached to the projection system the surface of the protrusion is closer to the barrier member than a part of the projection system on a radially inner side of the protrusion.

18. The method of claim 16, wherein the protrusion is located on a substantially horizontal part of the barrier member.

19. The method of claim 18, wherein the protrusion is located at or in proximity of the radially innermost portion of the horizontal part.

20. The method of claim 16, wherein the surface of the protrusion is liquidphobic.

21. The method of claim 16, wherein the projection system in proximity to the protrusion has a liquidphobic surface, the barrier member in proximity to the protrusion has a liquidphobic surface, or both.

22. The method of claim 16, wherein, in normal use, the level of liquid in the reservoir does not exceed a point at which a top surface meniscus of the liquid extends between the protrusion and the projection system or between the protrusion and the barrier member.

23. The method of claim 16, wherein the protrusion is positioned to deflect radially inwardly a flow of liquid from a direction of the substrate.

24. A device manufacturing method comprising projecting a patterned beam of radiation through a liquid onto a substrate using a projection system wherein the liquid is contained between the projection system and the substrate at least in part by a barrier member, the barrier member, the projection system, or both, shaped such that there is a step increase in a distance between the barrier member and the projection system and a meniscus extends on one side of the step between the barrier member and the projection system.

25. The method of claim 24, wherein the protrusion is located on a substantially horizontal part of the barrier member.

26. The method of claim 25, wherein the protrusion is located at or in proximity of the radially innermost portion of the horizontal part.

27. The method of claim 24, wherein the surface of the protrusion is liquidphobic.

28. The method of claim 24, wherein the projection system in proximity to the protrusion has a liquidphobic surface, the barrier member in proximity to the protrusion has a liquidphobic surface, or both.

29. The method of claim 24, wherein, in normal use, the level of liquid in the reservoir does not exceed a point at which a top surface meniscus of the liquid extends between the protrusion and the projection system or between the protrusion and the barrier member.

30. The method of claim 24, wherein the protrusion is positioned to deflect radially inwardly a flow of liquid from a direction of the substrate.

31. A lithographic apparatus, comprising:
a projection system configured to project a patterned radiation beam onto a target portion of a substrate;
a barrier member, surrounding a space between the projection system and the substrate, to define in part a reservoir for liquid; and
a protrusion which surrounds the projection system and is on the projection system such that a surface of the protrusion is closer to the barrier member than a part of the projection system on a radially outward side of the protrusion is to the surface of the barrier member.

32. The apparatus of claim 31, wherein the protrusion is attached to the projection system such that the surface of the protrusion is closer to the barrier member than a part of the projection system on a radially inner side of the protrusion is to the surface of the projection system.

* * * * *